United States Patent
Chen et al.

(10) Patent No.: US 6,818,547 B2
(45) Date of Patent: Nov. 16, 2004

(54) DUAL DAMASCENE PROCESS

(75) Inventors: Meng-Hung Chen, Taoyuan Hsien (TW); Yu-Sheng Shu, Taoyuan (TW); Ming Hung Lo, Taoyuan Hsien (TW); Chung-Yuan Lee, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/229,734

(22) Filed: Aug. 27, 2002

(65) Prior Publication Data

US 2003/0211727 A1 Nov. 13, 2003

(30) Foreign Application Priority Data

May 13, 2002 (TW) ........................................ 91109932 A

(51) Int. Cl.$^7$ ........................................ H01L 21/4763
(52) U.S. Cl. ........................ 438/618; 438/669; 438/720; 438/737
(58) Field of Search ................................ 438/618, 622, 438/626–629, 631–633, 637–638, 642–643, 645, 647–648, 652–653, 656–657, 669, 672, 692, 720, 723, 734, 736–737, 742–743

(56) References Cited

U.S. PATENT DOCUMENTS

| | | | | | |
|---|---|---|---|---|---|
| 5,614,765 | A | * | 3/1997 | Avanzino et al. | 257/774 |
| 6,211,061 | B1 | * | 4/2001 | Chen et al. | 438/622 |
| 6,300,235 | B1 | * | 10/2001 | Feldner et al. | 438/618 |
| 2003/0008490 | A1 | * | 1/2003 | Xing et al | 438/622 |

* cited by examiner

Primary Examiner—Wael Fahmy
Assistant Examiner—Ginette Peralta
(74) Attorney, Agent, or Firm—Merchant & Gould P.C.

(57) ABSTRACT

A dual damascene process for producing interconnects. A dielectric layer is formed over the surface of a semiconductor substrate which comprises conductive layers or MOS devices. The dielectric layer is patterned to form trench openings and a metal layer is deposited over the dielectric layer to fill the plurality of trenches. A photoresist layer is formed over the metal layer and defined to form via hole patterns above the trenches. The metal layer and the dielectric layer are etched with the patterned photoresist layer as a mask to form a plurality of via holes exposing the underlying conductive layer or MOS devices and a dual damascene opening is formed.

19 Claims, 7 Drawing Sheets

DUAL DAMASCENE PROCESS

BACKGROUND OF THE INVENTION

1. Field of the Invention

The present invention relates to semiconductor process, and more particularly to a method for manufacturing interconnects using a dual damascene process.

2. Description of the Related Art

In the fabrication of very large scale integrated (VLSI) circuits, semiconductor devices are generally linked by several metallic interconnecting layers commonly referred to as multilevel interconnects. As the level of circuit integration continues to increase, manufacturing processes are complicated and product yield and reliability is harder to maintain. Dual damascene process is a convenient method for forming multilevel interconnects. Principally, the process includes etching a dielectric layer to form trenches and via holes, and then depositing metal into the trenches and via holes to form the interconnects. The dual damascene process is capable of producing highly reliable interconnects with a relatively high product yield. Due to its versatility, the dual damascene process has become a predominant method for fabricating interconnects.

FIGS. 1A–1F illustrate a conventional process flow to fabricate dual damascene structures to connect semiconductor devices as support contacts. As shown in FIG. 1A, semiconductor devices are formed on a semiconductor substrate 100 and composed of gate 102, source/drain regions 106 and 108. Semiconductor devices are isolated by isolation structures 104. A nitride layer 110 is deposited over the gate 102 and a boro-phosphosilicate glass (BPSG) layer 112 is formed over the surface of the semiconductor substrate 100 for insulating. A dielectric layer, tetra-ethyl-ortho-silicate (TEOS), 114 is formed over the BPSG layer 112.

The dielectric layer 114 is defined by photolithography and etched to form a plurality of trenches 114a. First photoresist layer 116 is formed over the dielectric layer 114 to fill the trenches 114a. Second photoresist layer 118 is formed over the first photoresist layer as an image layer as shown in FIG. 1B and the thickness of the second photoresist layer 118 is smaller than the first photoresist layer 116. The bi-layer photoresist structure can achieve good photolithography quality by thoroughly filling the trenches 114a.

In FIG. 1C, the second photoresist layer 118 is patterned to defined via openings 118a above the trenches 114a by photolithography. The first photoresist layer 116 is patterned subsequently by dry etching using the patterned second photoresist layer 118 as a mask and via openings 116a are formed in the first photoresist layer 116 as FIG. 1D shows. In FIG. 1E, via openings 102a, 106a and 108a are formed above the gate 102 and the source/drain regions 106 and 108 respectively by etching the boro-phosphosilicate glass (BPSG) layer 112 and the tetra-ethyl-ortho-silicate (TEOS) 114 with the first and second patterned photoresist layers 116 and 118 as mask.

After removing the first and second photoresist layers 116 and 118, dual damascene openings are formed above the gate 102 and the source/drain regions 106 and 108. Interconnect structures 120 are formed by filling the dual damascene openings with conductive materials as shown in FIG. 1F.

Conventionally, the second photoresist layer 118 is Si-containing photoresist material which easily outgasses and contaminates equipment during photolithography. Additionally, dry etching the first photoresist layer 116 with oxygen gas will also oxidize the surface of the second photoresist layer 118 to form silicon oxide. After the first and second photoresist layers 116 and 118 are removed, there will be undesired silicon oxide residue on the semiconductor substrate, creating extra cleaning steps. It will enlarge dielectric oxide via opening critical dimension (CD) while removing the silicon oxide residue.

SUMMARY OF THE INVENTION

One object of the present invention is to provide a dual damascene process with W/TiN as the filling material to prevent residue.

To achieve the above-mentioned object, the present invention provides a dual damascene process including the following steps. A dielectric layer is formed over the surface of a semiconductor substrate which comprises conductive layers or MOS devices. The dielectric layer is patterned to form a plurality of trench openings and a conducting layer is deposited over the dielectric layer to fill the plurality of trenches. A photoresist layer is formed over the conducting layer and defined to form a plurality of via hole patterns above the plurality of trenches. The conducting layer and the dielectric layer are etched using the patterned photoresist layer as a mask to form a plurality of via holes exposing the underlying conductive layers or MOS devices and a dual damascene structure opening is formed.

According to the present invention, the preferred dielectric layer is tetra-ethyl-ortho-silicate (TEOS) or non-doped silicon glass (NSG) and the preferred conducting layer is tungsten (w) or polysilicon. The via plugs in the dual damascene structure can be contacts connecting the MOS devices in the semiconductor substrate and the upper interconnect metal lines.

The dual damascene process can further comprise a step of forming a barrier layer in the via and trench openings before filling the conducting layer. The preferred barrier layer is TiN, TaN or TiW and the preferred thickness is about 250–300 angstroms (Å).

According to one preferred embodiment of the invention, depositing a conducting layer over the barrier layer to fill the plurality of trenches further comprises the steps of: depositing the conducting layer over the barrier layer to fill the plurality of trenches, and etching back the conducting layer to form a smooth surface with a predetermined thickness above the dielectric layer. Etching back the conducting layer can be performed by chemical mechanical polishing (CMP) to form a conducting layer with a thickness between 400 to 500 angstroms.

According to one preferred embodiment of the invention, etching the conducting layer and the dielectric layer with the patterned photoresist layer as a mask to form a plurality of via holes further comprises the steps of: dry etching the conducting layer with the patterned photoresist layer as a mask, removing the photoresist layer, and dry etching the dielectric layer with the conducting layer as a mask to expose the underlying conductive layers or MOS devices and plurality of via holes are formed.

BRIEF DESCRIPTION OF THE DRAWINGS

The present invention will become more fully understood from the detailed description given herein below and the accompanying drawings, given by way of illustration only and thus not intended to be limitative of the present invention. In the drawings.

DETAILED DESCRIPTION OF THE INVENTION

Figure 1A:
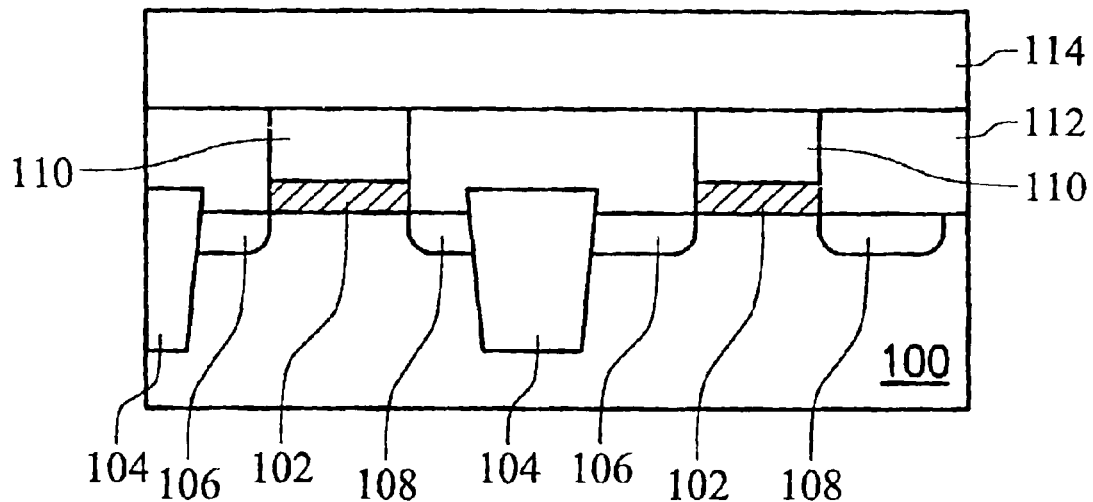
FIGS. 1A–1F illustrate a conventional dual damascene process of forming contact structures on MOS devices.
Figure 1B:
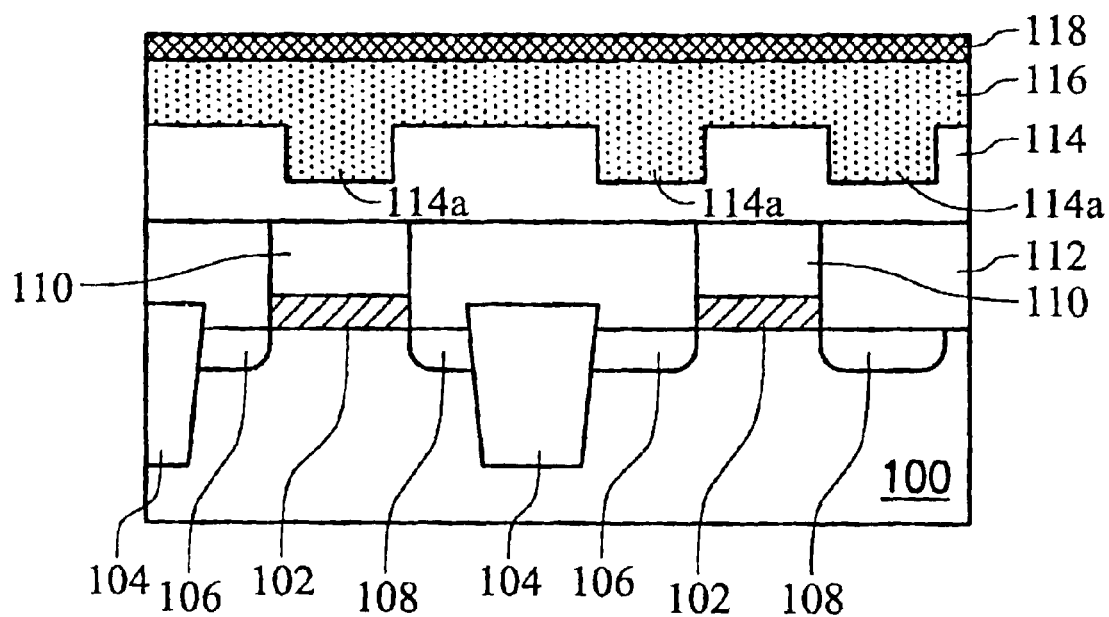
Figure 1C:
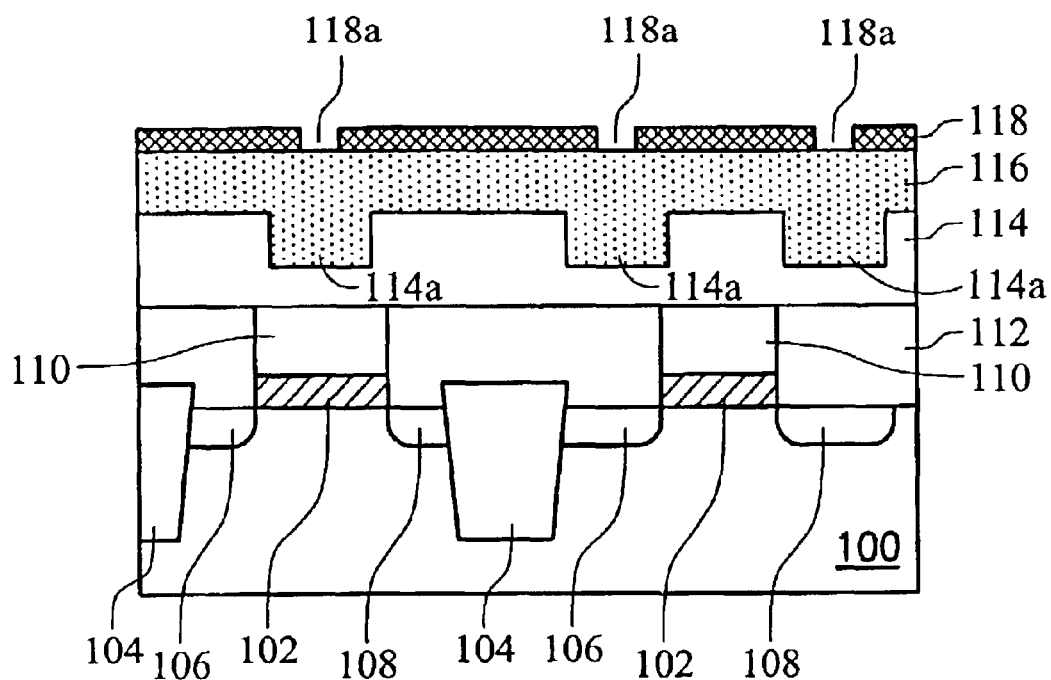
Figure 1D:
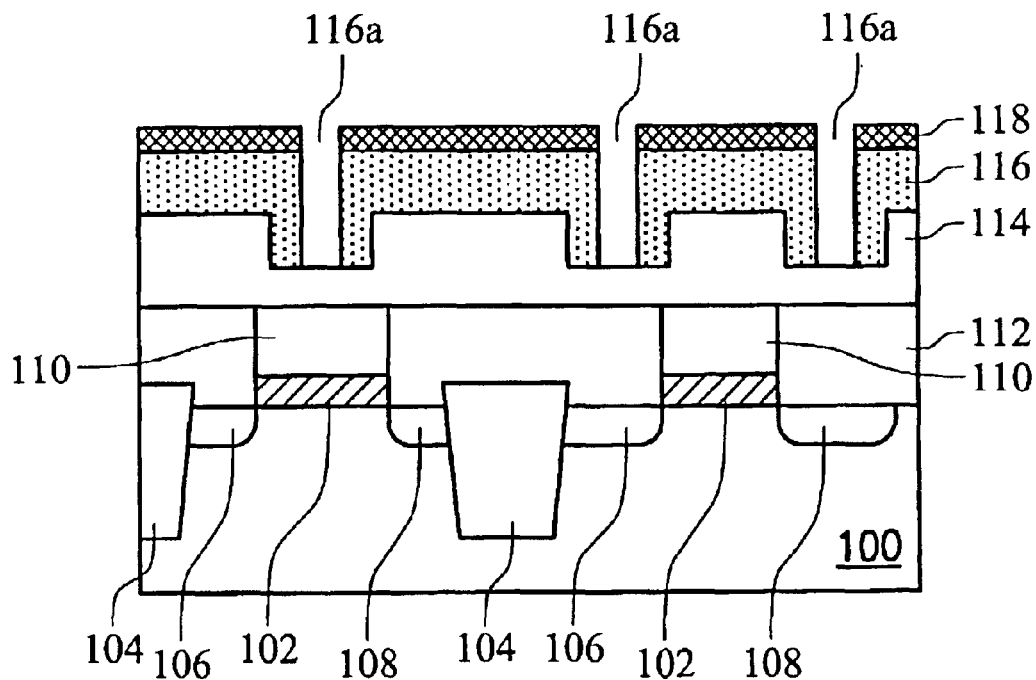
Figure 1E:
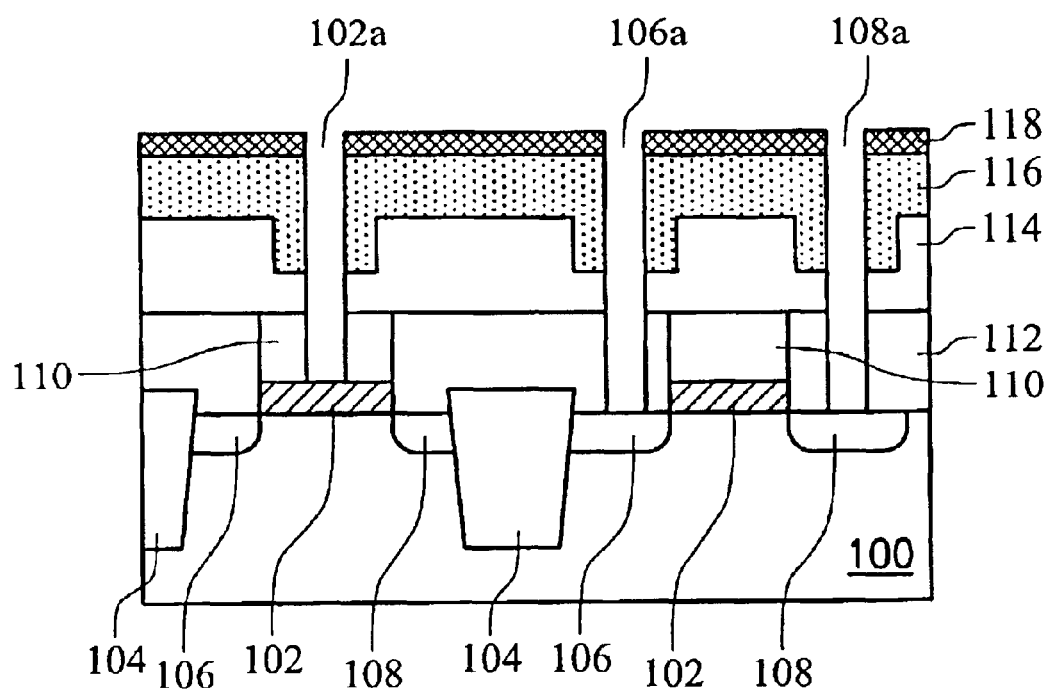
Figure 1F:
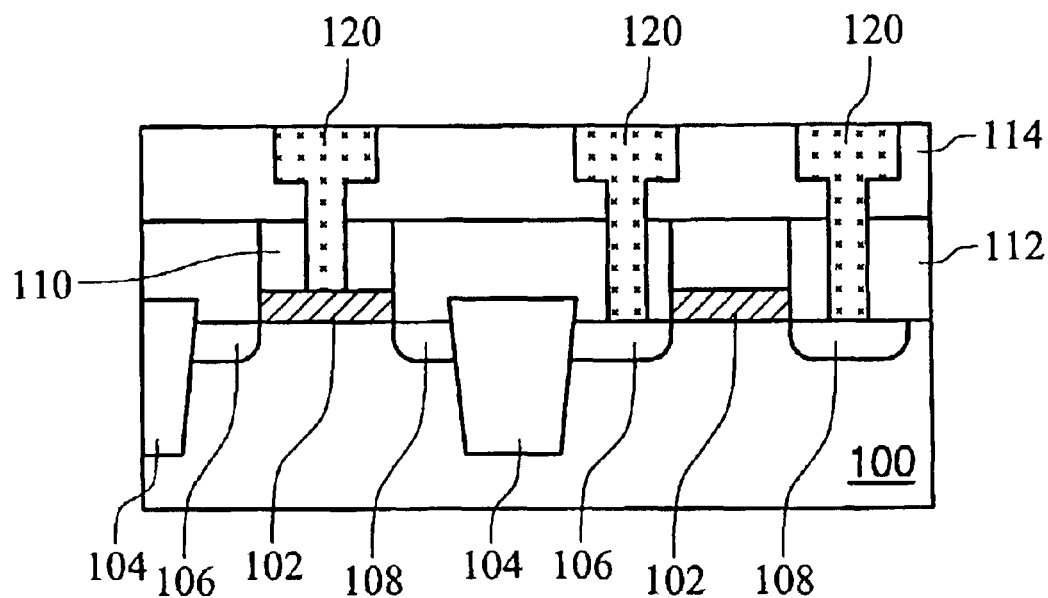
Figure 2A:
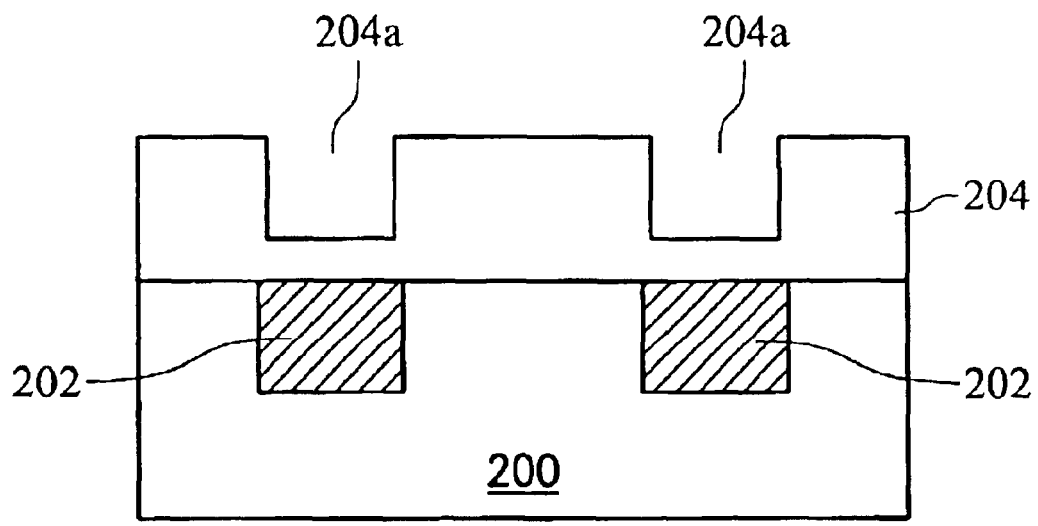
FIGS. 2A–2G illustrate a dual damascene process according to one embodiment of the present invention.

FIGS. 2A through 2G are schematic cross-sections illustrating the steps for forming interconnects using a dual damascene process according to one preferred embodiment of the present invention. As shown in FIG. 2A, there are conductive layers 202 formed in a semiconductor substrate 200. The conductive layers 202 can be interconnect metal lines, bit lines or word lines. A dielectric layer 204 is deposited over the surface of the semiconductor substrate 200 and the preferred dielectric layer is tetra-ethyl-ortho-silicate (TEOS) or non-doped silicon glass (NSG). A plurality of trench openings 204a are formed in the dielectric layer 204 above the conductive layers 202 by conventional photolithography and etching.

Figure 2B:
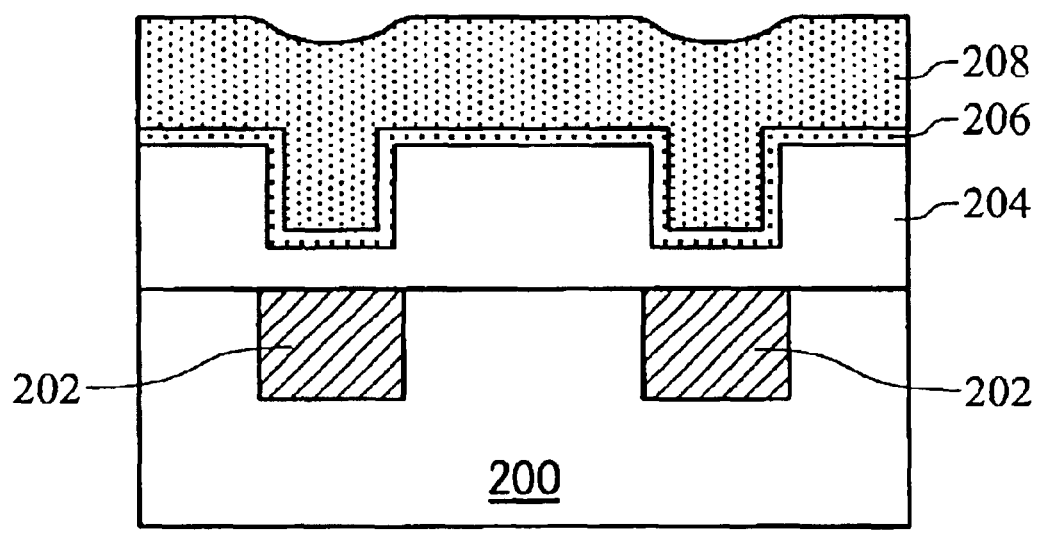

Preferably, a barrier layer 206 is formed over the surface of the dielectric layer 204 and in the plurality of trench openings as FIG. 2B shows. The preferred barrier layer is TiN, TaN or TiW and the preferred thickness is about 250 to 300 angstroms. The barrier layer 206 can improve the adherence between the dielectric layer 204 and the following metal plugs and metal lines and prevent spiking in the interface. A conducting layer 208 is deposited over the barrier layer 206 to fill the plurality of trenches 204a and lay over the surface of the semiconductor substrate in a sufficient thickness. The conducting layer can be conventional material for via plugs, such as tungsten or polysilicon, and the deposition thickness of the conducting layer is about 5000 angstroms.

Figure 2C:
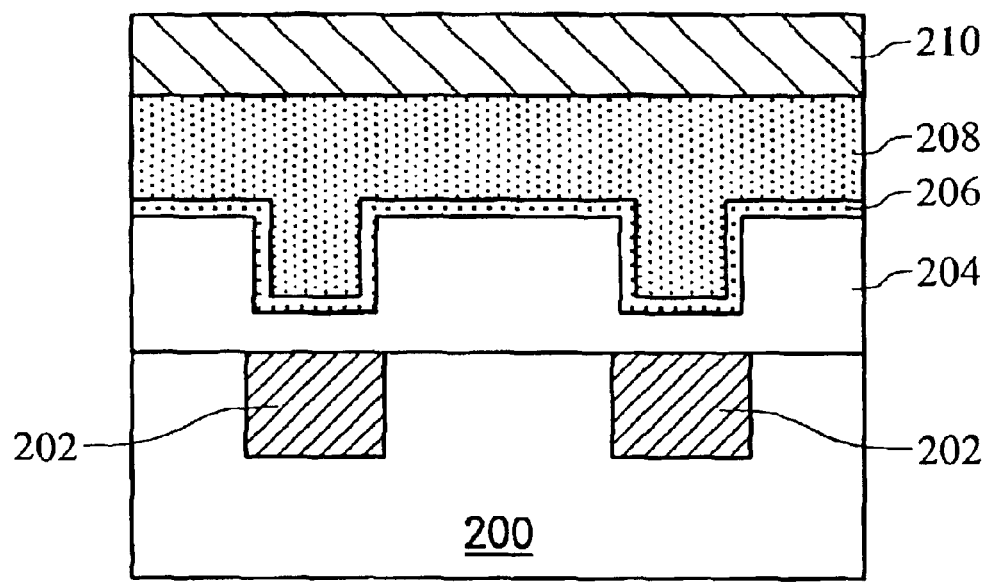

A planarization process is then performed. In FIG. 2C, the conducting layer 208 is planarized to form a smooth surface by chemical mechanical polishing (CMP). The metal layer 208 is polished until the thickness on the dielectric layer 204 is about 400 to 500 angstroms. A photoresist layer 210 is formed subsequently over the smooth surface of the metal layer 208. Since the metal layer 208 is deposited and polished back to fill the uneven dielectric layer 204 and provide a flat bottom layer for the photoresist layer 210, the following photolithography can achieve equal quality with conventional bi-layer photoresist.

Figure 2D:
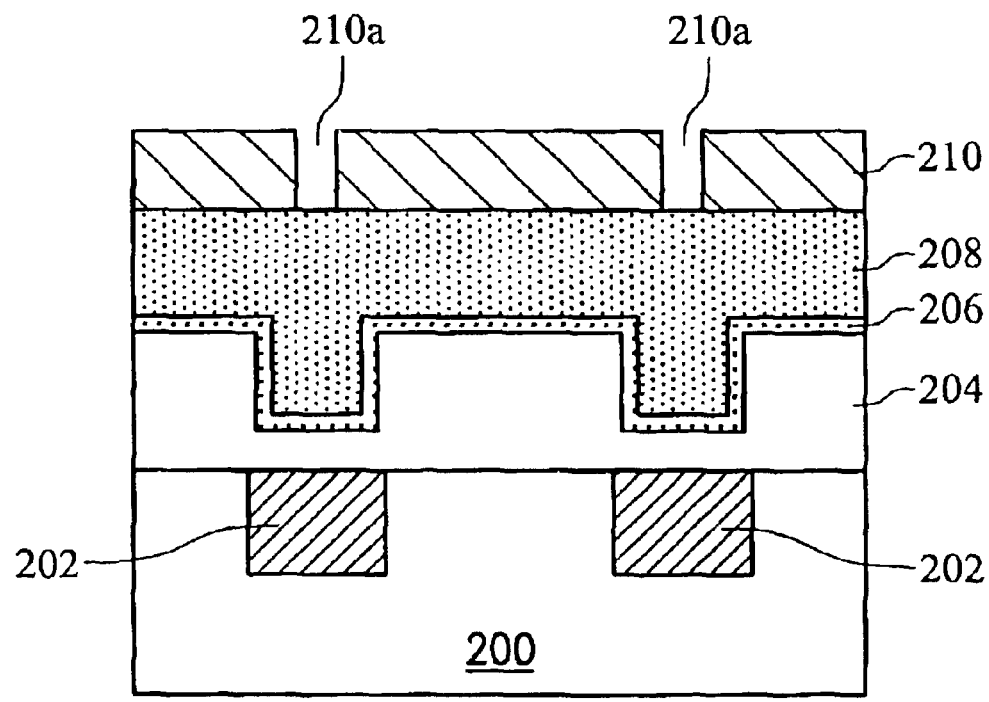

The photoresist layer 210 is patterned to form via openings 210a above the trenches 204a by photolithography as FIG. 2D shows.

Figure 2E:
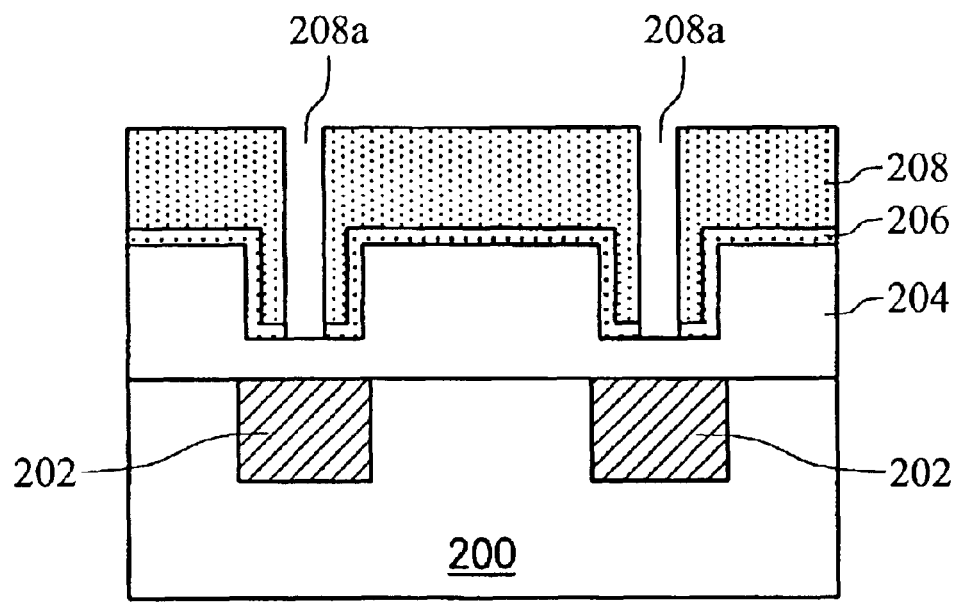

Using the patterned photoresist layer 210 as a mask, a pattern transfer etching is performed. In FIG. 2E, the conducting layer 208 and the barrier layer 206 are patterned by dry etching to form via hole openings 208a and then the photoresist layer 210 is removed.

Figure 2F:
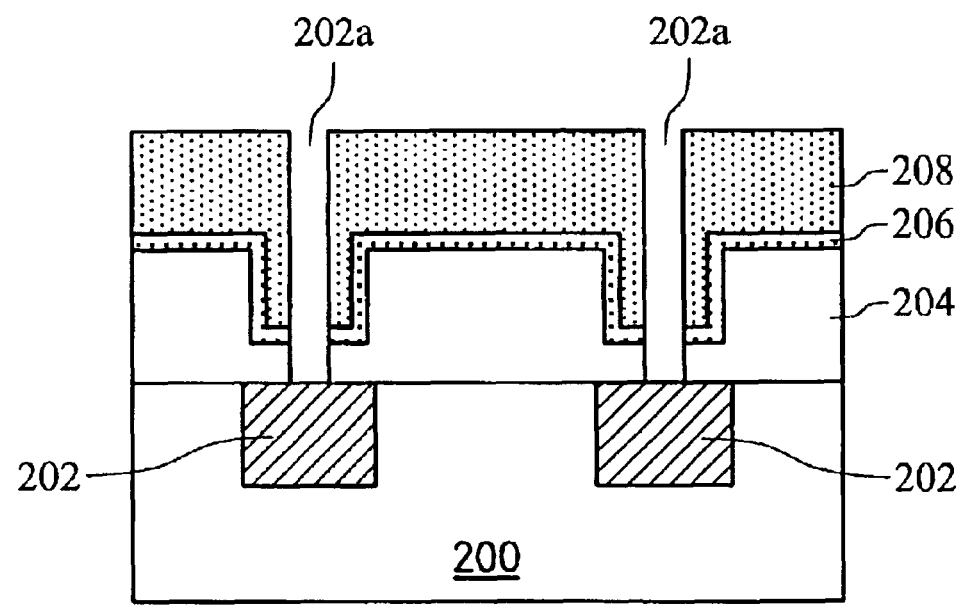

In FIG. 2F, the dielectric layer 204 is dry etched with the patterned conducting layer 208 and barrier layer 206 as a mask and via holes 202a are formed to expose the underlying conductive layer 202 in the semiconductor layer 200. Dual damascene structures are formed and composed of the via holes 202a and trenches in the dielectric layer 204. Generally, an etch post cleaning is performed after the via holes 202a formation to remove residue. Since the material of the conducting layer 108 is chosen from conventional via plug materials, no residue or contaminants remain because of the routine post-etch cleaning.

Figure 2G:
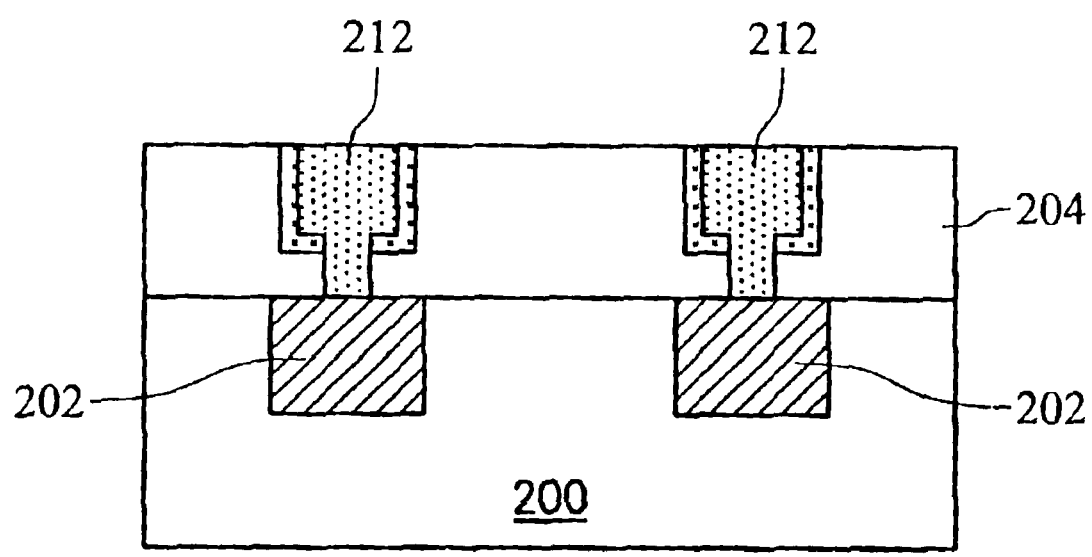

In FIG. 2G, the via holes 202a are filled with conductive material, such as tungsten or conventional metal plug materials. Finally, the semiconductor substrate 200 is planarized by chemical mechanical polishing. The dual damascene structures 212 filled with the conductive material are formed to connect the underlying conductive layer 202 in semiconductor substrate 200.

One feature of the present invention is to fill the trench openings with conventional via plug materials to form a flat surface for the following photoresist layer formation. The metal layer can be etched and cleaned by conventional process without residue. Another feature of the present invention is that the material of the filling conducting layer can be the same as the conductive material in the dual damascene structure, and therefore, there is no need to remove the filling material in the trenches, which simplifies the dual damascene structure filling process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A dual damascene process, comprising the steps of:
   depositing a dielectric layer over a semiconductor substrate, wherein the semiconductor substrate has a conductive region therein;
   patterning the dielectric layer to form a plurality of trenches;
   depositing a conducting layer over the dielectric layer to fill the plurality of trenches;
   etching back the conducting layer to form a smooth and flat surface with a predetermined thickness on the dielectric layer;
   forming a photoresist layer directly on the conducting layer;
   defining the photoresist layer to form a plurality of via hole patterns above the plurality of trenches; and
   etching the conducting and the dielectric layer with the patterned photoresist layer to form a plurality of via holes exposing the conductive layer.

2. The process as claimed in claim 1, further comprising a step of forming a barrier layer over the dielectric layer and in the plurality of trenches before depositing the conducting layer.

3. The process as claimed in claim 2, wherein the barrier layer is TiN, TaN, or TiW.

4. The process as claimed in claim 3, wherein the thickness of the barrier layer is about 250 Å to 300 Å.

5. The process as claimed in claim 1, wherein etching back the conducting layer to form the smooth surface is performed by chemical mechanical polishing (CMP).

6. The process as claimed in claim 1, wherein the predetermined thickness of the conducting layer is about 400 Å to 500 Å.

7. The process as claimed in claim 1, wherein etching the conducting layer and the dielectric layer with the patterned photoresist layer to form a plurality of via holes further comprises the following steps:
   dry etching the conducting layer with the patterned photoresist layer to form the patterned conducting layer;
   removing the patterned photoresist layer; and
   dry etching the dielectric layer with the patterned conducting layer to form the plurality of via holes exposing the conductive layer on the semiconductor substrate.

8. The process as claimed in claim 1, wherein the dielectric layer comprises tetra-ethyl-ortho-silicate (TEOS) or non-doped silicon glass (NSG).

9. The process as claimed in claim 1, wherein the conducting layer comprises tungsten or polysilicon.

10. The process as claimed in claim 1, wherein the via holes are contacts.

11. A dual damascene process for a semiconductor substrate with a conductive region therein, comprising the steps of:

depositing a dielectric layer over the semiconductor substrate;

patterning the dielectric layer to form a plurality of trenches;

depositing a barrier layer over the dielectric layer and in the plurality of trenches;

depositing a conducting layer over the barrier layer to fill the plurality of trenches;

etching back the conducting layer to form a smooth and flat surface with a predetermined thickness on the barrier layer;

forming a photoresist layer directly on the conducting layer;

defining the photoresist layer to form a plurality of via hole patterns above the plurality of trenches; and etching the conducting layer, the barrier layer and the dielectric layer with the patterned photoresist layer to form a plurality of via holes exposing the conductive layer on the semiconductor substrate.

12. The process as claimed in claim 11, wherein etching the conducting layer, the barrier layer and the dielectric layer with the patterned photoresist layer to form a plurality of via holes further comprises the following steps:

dry etching the conducting layer and the barrier layer with the patterned photoresist layer to form patterned conducting layer and barrier layer;

removing the patterned photoresist layer; and dry etching the dielectric layer with the patterned conducting layer and barrier layer to form the plurality of via holes exposing the conductive layer.

13. The process as claimed in claim 11, wherein the barrier layer is TiN, TaN, or TiW.

14. The process as claimed in claim 13, wherein the thickness of the barrier layer is about 250 Å to 300 Å.

15. The process as claimed in claim 11, wherein the conducting layer comprises tungsten or polysilicon.

16. The process as claimed in claim 11, wherein etching back the conducting layer to form the smooth surface is performed by chemical mechanical polishing (CMP).

17. The process as claimed in claim 16, wherein the predetermined thickness of the conducting layer is about 400 Å to 500 Å.

18. The process as claimed in claim 11, wherein the via holes are contacts.

19. The process as claimed in claim 11, wherein the dielectric layer comprises tetra-ethyl-ortho-silicate (TEOS) or non-doped silicon glass (NSG).

* * * * *